United States Patent [19]

Rankel

[11] 3,751,314

[45] Aug. 7, 1973

[54] SILICON SEMICONDUCTOR DEVICE PROCESSING

[75] Inventor: Lillian Ann Rankel, Piscataway, N.J.

[73] Assignee: Bell Telephone Laboratories, Incorporated, Murray Hill, N.J.

[22] Filed: July 1, 1971

[21] Appl. No.: 158,787

[52] U.S. Cl. .................... 156/17, 29/571, 148/185
[51] Int. Cl. .................... H01l 7/50, H01l 7/44
[58] Field of Search .................... 156/17; 148/33.5, 148/185; 29/571

[56] References Cited

UNITED STATES PATENTS 3,541,676 11/1970 Brown .................... 29/571
3,484,309 12/1969 Gilbert .................... 148/33.5
2,927,011 3/1960 Stead .................... 156/17

*Primary Examiner*—Jacob H. Steinberg
*Attorney*—W. L. Keefauver et al.

[57] ABSTRACT

Silicon semiconductor devices containing boron doped regions are produced using borosilicate glass as a doping source and silica glass as a masking layer. After the device is heated to produce boron diffusion into the silicon surface, a preferential etchant is used to remove the borosilicate glass while leaving the masking layer substantially in place for use in subsequent processing steps. The etchant is an aqueous solution of HF and $HNO_3$.

5 Claims, 6 Drawing Figures

PATENTED AUG 7 1973 3,751,314

INVENTOR
L.A. RANKEL
BY George S. Indig
ATTORNEY

SILICON SEMICONDUCTOR DEVICE PROCESSING

BACKGROUND OF THE INVENTION

1. Field of the Invention

Processing of boron doped silicon semiconductor devices.

2. Description of the Prior Art

In the fabrication of silicon semiconductor devices there are a number of related processes involving the use of a borosilicate glass as a boron doping source. In one of these processes the glass is formed on the silicon surface at a low temperature (e.g. <500°C) from gaseous reactants such as diborane together with silane and oxygen. Glasses so produced usually contain between 5 weight percent and 15 weight percent boron. The device is subsequently subjected to a high temperature heat treatment (e.g. >900°C) in order to allow diffusion of boron into the silicon substrate. In another glass process deposition takes place at a higher temperature so that at least some of the diffusion takes place during the deposition process. This latter process utilizes boron nitride together with oxygen as gaseous reactants for glass deposition. This process, as usually practiced, results in the formation on the silicon substrate, of a borosilicate glass containing from 0.2 to 2 weight percent boron.

Silicon device technology often requires that the borosilicate glass be in direct contact with the silicon substrate only over limited areas. This is usually accomplished by the use of a silicon dioxide (silica) glass masking layer. Such a layer can be formed over the whole substrate, for instance, by steam oxidizing the silicon. Subsequently, the limited areas of the silicon substrate at which boron diffusion is to take place are bared by photolithographic techniques. The borosilicate glass can be then formed over both the exposed areas and the silicon dioxide masking layer and boron diffusion allowed to proceed.

After the desired boron diffusion has taken place, the borosilicate glass layer must be removed so that there is no further introduction of boron during subsequent fabrication steps. This usually necessitates removal of the underlying silicon dioxide masking layer. However, it may be desirable to preserve the masking layer for further use. This would ease the registration problems which would otherwise be met, for instance, in subsequent metalization steps.

Most etchants in common use contain hydrofluoric acid as an active ingredient. One such etchant, reported to Pliskin contains hydrofluoric acid and nitric acid in roughly equal concentration (W. A. Pliskin et al. *Journal of the Electrochemical Society*, 111 [1964] 872). The authors used the preferential properties of this etchant to study diffusion in mixed oxide glasses.

SUMMARY OF THE INVENTION

A new procedure for the fabrication of boron doped silicon devices has been found, including the use of a preferential etchant, which permits the borosilicate glass doping source to be removed while leaving the silicon dioxide glass masking layer substantially intact. In this process the silicon dioxide glass masking layer is formed on the silicon surface. It is formed with a pattern of openings or a pattern of openings is subsequently etched leaving exposed areas of the silicon substrate where boron doping is desired. The borosilicate glass layer is then formed over at least the exposed areas of the silicon substrate. In most cases the borosilicate glass will be produced over the entire area of the slice. This borosilicate deposition can be produced by one of the low temperature or high temperature processes which results in the formation of a layer containing between 0.2 and 15 weight percent boron. The boron diffusion takes place when the device is subjected to high temperatures during a high temperature borosilicate glass deposition and/or during a subsequent heat treating step.

After diffusion the borosilicate glass is removed by the immersion of the device into a combined fluoride and nitric acid etchant. This etachant contains hydrofluoric acid in a concentration from 0.1 molar to 4 molar and nitric acid in a concentration from 4 molar to 8 molar, where the nitric acid molar concentration is at least twice the molar concentration of the hydrofluoric acid. This etchant removes borosilicate glass at a rate greater than three times the rate of removal of the silica glass so that the borosilicate glass can be completely removed while leaving the silica glass layer substantially intact.

DETAILED DESCRIPTION OF THE INVENTION

Figure 1:
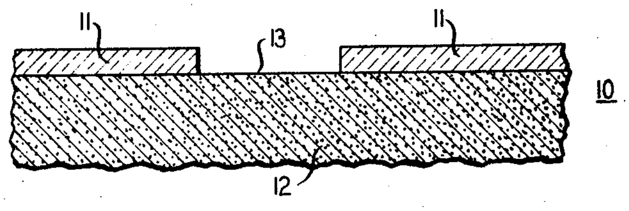
FIGS. 1 through 6 are elevational views in cross-section of a silicon semiconductor device in various stages of fabrication.

The figures show a portion of a silicon p-n junction device 10 in six stages of processing. In FIG. 1 a silica glass masking layer 11 has been formed on a surface of a silicon substrate 12. The masking layer 11 has been formed with an opening which exposes the silicon surface over a limited area 13. In one common process, the silica glass is formed over the entire surface of the substrate 12 by steam oxidizing the substrate 12 at a temperature of the order of 1100°C. The exposed area 13 is then produced by photolithography.

Figure 2:
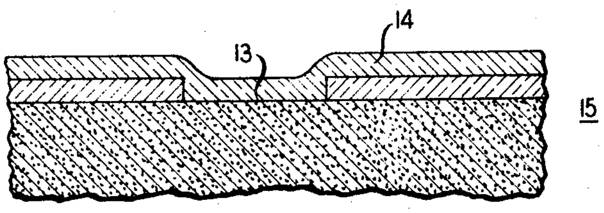

Processing then continues (as in FIG. 2) with the formation of a boron-containing silica glass (borosilicate glass) layer 14 which serves as a source of boron for the p-type doping of the silicon underlying the exposed area 13. This borosilicate glass containing between 0.2 and 15 percent boron by weight can be produced, for example, by the reaction of diborane, silane, and oxygen on the surface at a temperature of the order of 350°C or by the reaction of boron nitride and oxygen on the surface at a temperature of the order of 1,150°C. After borosilicate glass is formed, boron diffuses into the silicon underlying surface 13 when the temperature of the device 15 is above 800°C until a p-n junction 16 is produced. If the borosilicate glass layer 14 is formed by a process taking place at less than 800°C, such as the diborane process mentioned above, the boron diffusion takes place during a subsequent heat treatment. If the borosilicate glass layer 14 is formed by a high temperature process, such as the boron nitride process mentioned above, at least some of the diffusion takes place during the borosilicate glass formation.

Figure 3:
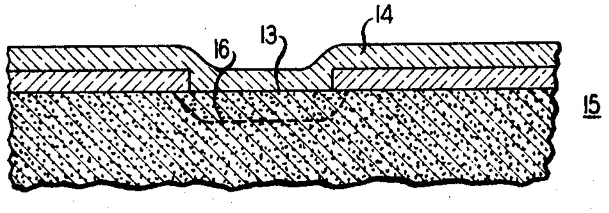
Figure 4:
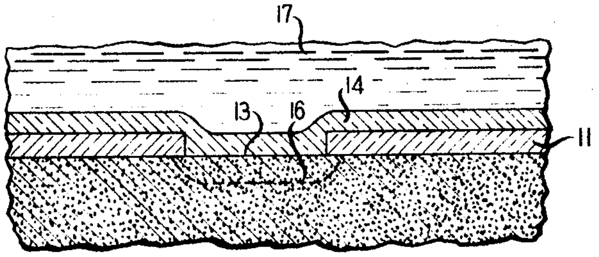
Figure 5:
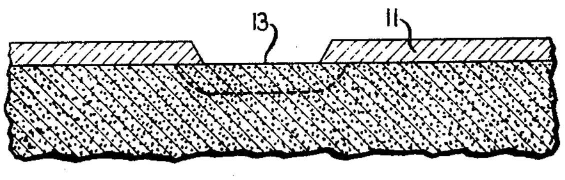
Figure 6:
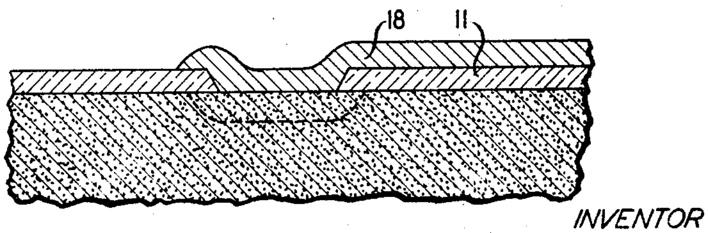

After the p-n junction 16 is produced as in FIG. 3 the borosilicate glass layer 14 must be removed in order to prevent further introduction of boron into the silicon during subsequent processing steps. In many cases, it is desirable to remove the borosilicate glass layer 14 while leaving the silica glass masking layer 11 essentially undisturbed so that it can function as a mask during subsequent processing steps. This is accomplished through the use of a preferential etchant 17 as in FIG. 4. The etchant is an aqueous solution of nitric acid together with hydrofluoric acid. This etchant removes the borosilicate glass 14 at a rate more than three times as fast as the removal of the silica glass 11. This preferential ratio is large enough to leave, as in FIG. 5, the exposed portion of the silicon surface 13 free of borosilicate glass while leaving the silica glass masking layer 11 essentially intact. Lower ratios lead to progressively greater degradation of the mask 11. Preferential ratios greater than 3.5 make the etching more easy to accomplish with even less degradation of the mask. As in FIG. 6, this masking layer 11 can now function as a mask during subsequent processing steps such as the deposition of a metallic contact 18.

Etchants

The combined nitric acid-fluoride etchant, used in the processing described above, attacks borosilicate glass preferentially with respect to silica glass. In order to remove borosilicate glass while leaving the silica glass masking layer substantially intact for further use, it is desirable to achieve a differential etch rate greater than three. That is to say — the etchant should remove borosilicate glass at a rate more than three times the rate at which silica glass is removed. The etchant should also be strong enough to remove the borosilicate glass within a time commensurate with ordinary industral processing. For instance a 1,000 A. thick layer of glass should be removed in a time greater than 60 seconds, but less than one hour. Times less than 60 seconds are difficult to control, while times longer than 1 hour are generally uneconomical. In many cases, when etching relatively thick borosilicate glass layers it is also desirable that the etchant not attack the underlying silicon at a rate greater than 2,500 A. per minute so that the boron diffusion layer is not removed along with the glass.

A differential etch rate greater than three and reasonable processing times are accomplished using an etchant which is an aqueous solution containing HF in a total molar concentration between 0.1 molar and 4 molar, together with $HNO_3$ whose concentration is between 4 molar and 8 molar with the molar concentration of $HNO_3$ at least twice the molar concentration of the fluoride. The differential etch rate is greater than 3.5 for total fluoride concentrations between 0.3 molar and 3 molar. While the absolute etch rate varies with the temperature of the solution, becoming more rapid at higher temperatures, the differential etch rate is generally maintained as the temperature of the solution varies between 10°C and 90°C. The rate at which the etchant attacks silicon similarly varies with temperature. However at 25°C the silicon etch rate is less than 2,500 A. per minute if the sum of the molar concentrations of nitric acid and hydrofluoric acid is at most 9 molar.

The differential etch rate is also somewhat dependent upon the concentration of boron in the borosilicate glass. As the boron concentration is reduced below approximately 0.2 weight percent, the borosilicate glass becomes less distinguishable from the silica glass of the masking layer and the desired differential etch rate of three times, is not maintained over the above etchant composition range. When the boron concentration of the borosilicate glass becomes greater than of the order of 20 weight percent, there is sufficient diffusion of boron from the borosilicate glass in the silica glass masking layer to convert the silica glass into a borosilicate glass. The etchant will then attack the masking layer at a rate appropriate to a borosilicate glass and the preferential advantage is reduced. A differential etch rate of three is maintained by the disclosed etchants for borosilicate glasses less than 15 weight percent boron. Glass layers containing less than 10 weight percent boron are preferable to maintain the highest differential rates. The low temperature diborane process and the high temperature boron nitride process, discussed above, are usually operated so as to produce borosilicate glass layers less than 15 weight percent boron.

EXAMPLES

Exemplary procedures for the operation of the invention using diborane as the source of boron is as follows:

Example 1

1. The silicon slice is polished, cleaned and steam oxidized at 1,050°C until a 5,000A. thick silica glass layer is formed;
2. Selected areas of the silicon slice are exposed by photolithographic masking and subsequent etching;
3. A borosilicate glass layer containing of the order of 15 weight percent boron is produced by maintaining the slice at 350°C and flowing the reacting gas mixture over it at 7 liters per minute, the gas being composed of,
   $SiH_4$ — 0.085% by volume
   $B_2H_6$ — 0.0072% by volume
   O — 0.72% by volume
   N — remainder, until a layer 3,000A. thick is deposited;
4. The slice is then heated to 1,100°C and maintained at that temperature for 1 hour;
5. The slice is immersed in an aqueous solution containing 7.7 molar $HNO_3$ and 0.6 molar HF until the borosilicate glass is removed (approximately 4.5 minutes at 25°C). This etchant removed the silica glass at a rate of 175A. per minute and removed the borosilicate glass at a rate of 700A. per minute. The differential etch rate was, thus, 4.0.

Example 2

1. Steps (1) - (4) of Example 1 are repeated;
2. The slice is immersed in an aqueous solution containing 7.8 molar $HNO_3$ and 2.8 molar HF until the borosilicate glass is removed (approximately 0.9 minutes at 25°C). This etchant removes the silica glass at a rate of 900A. per minute and removes the borosilicate glass at a rate of 3,550A. per minute. The differential etch rate was, thus, 4.0.

An exemplary procedure for the operation of the invention using boron nitride as the source of boron is as follows:

Example 3

1. Steps (1) and (2) of Example 1 are repeated;
2. A borosilicate glass layer containing of the order of 1 weight percent boron is produced by maintaining the slice adjacent to a solid BN source at a temperature of 1,140°C. Nitrogen containing approximately one volume percent oxygen is flowed through the chamber from the source to the slice at a rate of 0.86 liters per minute until 500A. of borosilicate glass is deposited (≈½ hour);

3. The slice is immersed in an aqueous solution containing 7.8 molar $HNO_3$ and 0.6 molar HF until the borosilicate glass is removed (approximately 0.75 minutes at 25°C). This etchant removes the silica glass at a rate of 175A. per minute and removes the borosilicate glass at a rate of 670A. per minute. The differential etch rate is, thus, 3.8.

What is claimed is:

1. A method for the production of a silicon semiconductor device containing at least one p-n junction comprising:

1. producing a silicon substrate with a silica glass masking layer covering a first portion of the surface of the substrate while leaving a second portion of the substrate bare;
2. producing a borosilicate glass layer containing between 0.2 weight percent and 15 weight percent boron over at least part of the second portion; and
3. a glass removal step;

characterized in that the glass removal step consists essentially of contacting the borosilicate glass layer and at least part of the first portion with an etchant for a time at least sufficiently long to remove the borosilicate glass layer which etchant consists essentially of an aqueous solution of a first constituent and a second constituent wherein the first constituent is HF wherein the molar concentration of the first constituent is between 0.1 molar and 4 molar and the second constituent is $HNO_3$ wherein the molar concentration of the second constituent is between 4 molar and 8 molar and is at least two times the molar concentration of the first constituent which etchant removes the borosilicate glass layer at a rate more than three times the rate at which the etchant removes the silica glass masking layer whereby the borosilicate glass layer is removed while leaving the silica glass masking layer substantially intact.

2. A method of claim 1 in which the total molar concentration of the first constituent is between 0.3 molar and 3 molar.

3. A method of claim 2 in which the sum of the molar concentration of the first and second constituents is at most nine molar.

4. A method of claim 1 in which the borosilicate glass is maintained at a temperature above 800° for a time greater than 10 minutes allowing diffusion of boron into the n-type silicon substrate thereby producing a p-n junction.

5. A method of claim 1 in which the silica glass masking layer is produced by covering the first portion and the second portion of the substrate with silica glass and subsequently removing the silica glass from the second portion.

* * * * *